US011035920B2

(12) United States Patent
Wald et al.

(10) Patent No.: US 11,035,920 B2
(45) Date of Patent: Jun. 15, 2021

(54) SPARSE APPROXIMATE ENCODING OF WAVE-CAIPI: PRECONDITIONER AND NOISE REDUCTION

(71) Applicant: The General Hospital Corporation, Boston, MA (US)

(72) Inventors: Lawrence Wald, Charlestown, MA (US); Kawin Setsompop, Charlestown, MA (US); Stephen Cauley, Charlestown, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 16/510,174

(22) Filed: Jul. 12, 2019

(65) Prior Publication Data

US 2020/0018807 A1 Jan. 16, 2020

Related U.S. Application Data

(60) Provisional application No. 62/696,980, filed on Jul. 12, 2018.

(51) Int. Cl.

| | |
|---|---|
| ***G01V 3/00*** | (2006.01) |
| ***G01R 33/561*** | (2006.01) |
| ***G01R 33/56*** | (2006.01) |
| ***G01R 33/48*** | (2006.01) |

(52) U.S. Cl.
CPC ...... *G01R 33/5611* (2013.01); *G01R 33/4826* (2013.01); *G01R 33/5608* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS 4,604,579 A * 8/1986 Cannon .................. G01R 33/50 324/309
2006/0018398 A1 * 1/2006 Shamsunder ...... H04B 1/71052 375/267
2011/0241675 A1 * 10/2011 Constable .......... G01R 33/3415 324/309
2013/0099784 A1 * 4/2013 Setsompop ........ G01R 33/4826 324/309

* cited by examiner

*Primary Examiner* — Walter L Lindsay, Jr.
*Assistant Examiner* — Frederick Wenderoth
(74) *Attorney, Agent, or Firm* — Quarles & Brady LLP

(57) ABSTRACT

Described here are systems and methods for producing images of a subject using magnetic resonance imaging ("MRI") in which data are acquired using a sparse approximate encoding scheme for controlled aliasing techniques. As one example, the sparse approximate encoding can be used for a Wave-CAIPI encoding scheme, which can enable faster image reconstruction using fewer computational resources, in addition to reducing noise in the reconstructed images relative to those reconstructed from data acquired using a Wave-CAIPI encoding scheme without sparse approximate encoding.

14 Claims, 3 Drawing Sheets

SPARSE APPROXIMATE ENCODING OF WAVE-CAIPI: PRECONDITIONER AND NOISE REDUCTION

CROSS-REFERENCE TO RELATED APPLICATIONS

The present application is based on, claims priority to, and incorporates herein by reference in its entirety U.S. Provisional Application Ser. No. 62/696,980, filed Jul. 12, 2018, and entitled "SPARSE APPROXIMATE ENCODING OF WAVE-CAIPI: PRECONDITIONER AND NOISE REDUCTION."

STATEMENT REGARDING FEDERALLY SPONSORED RESEARCH

This invention was made with government support under EB019437, EB020613, MH106096, and EB015896 awarded by the National Institutes of Health. The government has certain rights in the invention.

BACKGROUND

Wave-CAIPI is an efficient MRI encoding technique that can be applied to many sequences. Wave-CAIPI is described, for example, in U.S. Pat. No. 8,981,776, which is herein incorporated by reference in its entirety. By utilizing sinusoidal gradients, the Wave-CAIPI method allows for high acceleration factors to be achieved with negligible g-factors. The iterative SENSE based reconstruction commonly used for Wave-CAIPI can be computationally costly given the high level of readout oversampling and large number of array coil elements utilized. In addition, when using Wave-CAIPI to achieve high acceleration factors, the intrinsic SNR penalty can cause the final images to be noisy.

SUMMARY OF THE DISCLOSURE

The present disclosure addresses the aforementioned drawbacks by providing a method for reconstructing an image of a subject using a magnetic resonance imaging (MRI) system. Data are accessed with a computer system. The data were acquired from a subject using an MRI system using an encoding scheme that distributes aliased spatial frequency information in three dimensions in k-space. An image of the subject is reconstructed from the data using the computer system. Reconstructing the image includes inputting the data to an iterative reconstruction algorithm that implements a sparse approximate encoding matrix, generating output as the reconstructed image.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
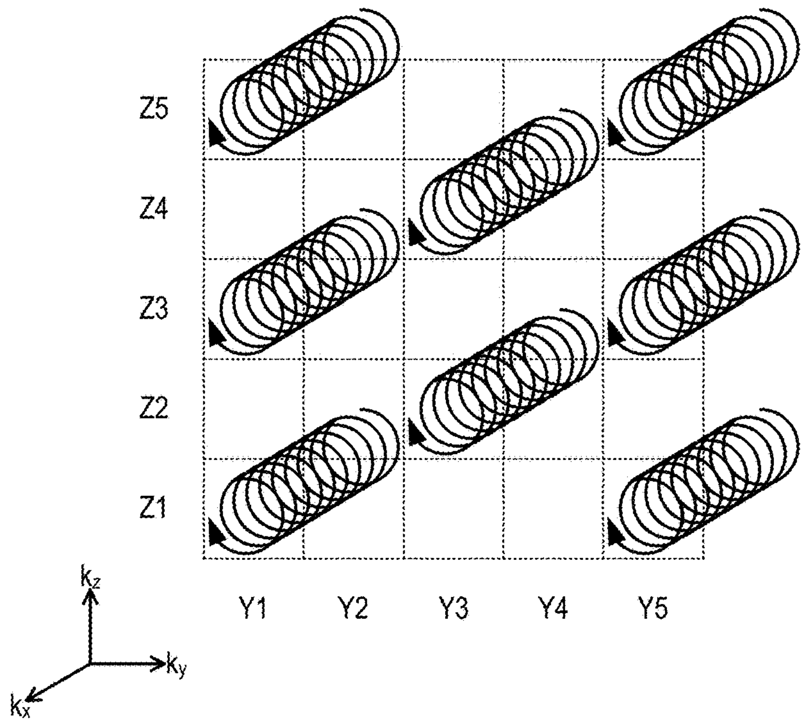
FIG. 1 is an example illustration of k-space trajectories that can be used for a Wave-CAIPI encoding scheme.

Described here are systems and methods for producing images of a subject using magnetic resonance imaging ("MRI") in which data are acquired using a sparse approximate encoding scheme for controlled aliasing techniques. As one example, the sparse approximate encoding can be used for a Wave-CAIPI encoding scheme, which can enable faster image reconstruction using fewer computational resources, in addition to reducing noise in the reconstructed images relative to those reconstructed from data acquired using a Wave-CAIPI encoding scheme without sparse approximate encoding.

The systems and methods described in the present disclosure thus use a sparse preconditioner for Wave-CAIPI encoding schemes, which allows for significant speed-up of iterative image reconstructions by removing the dependency on array coil channel count and over-sampling factors. The sparse approximate encoding of Wave-CAIPI also allows for the acquired data to be analyzed for dominate features, noisy features, or both. Based upon the number of cycles, the data can be binned and examined for low-rank structure. The low-rank property can be incorporated into the reconstruction as a penalty or used as a single denoising step. These properties are present for various different contrasts, and can be used for a joint reconstruction across SWI, MPRAGE, TSE, and so on.

The Wave-CAIPI encoding scheme improves imaging performance when undersampling is present in one or two directions, and provides good g-factor performance for three-dimensional imaging. In Wave-CAIPI, a k-space trajectory that effectively spreads aliasing patterns in all three spatial directions is used. This technique has the benefit of spreading the aliasing patterns throughout three dimensional space in a way that the aliasing patterns are spaced farther apart on average. As a result of this spreading out of the aliasing patterns, the aliased signals can be separated with less g-factor penalty than with previous methods.

The Wave-CAIPI encoding matrix can be accurately approximated by assuming an encoding sparsity pattern based upon the number of cycles played out by the imaging sequence. As one non-limiting example, it can be assumed that a given readout position is only coupled to voxels that are separated by an integer multiple of the number of cycles away from it. Given this fixed pattern, an encoding matrix with a sparse block Toeplitz matrix structure can be formed quickly. The size of each block is the number of readout voxels (no oversampling factor), and the number of blocks is based upon the acceleration factor. For instance, an acceleration factor of $R=3\times3$ would couple nine readout lines.

This sparse encoding matrix can then be scaled by the sensitivity weights for a SENSE-based parallel imaging reconstruction. These sensitivity map based weights can be computed during the acquisition of the MRI data, allowing for efficient construction of the preconditioner. In the presence of field-of-view ("FOV") tilting, gradient heterogeneity can cause additional spatially varying aliasing patterns.

These aliasing patterns can be accurately modeled as a sparse tridiagonal matrix, which can then be applied to the sparse encoding matrix described above.

Given that both matrices are sparse, this multiplication is very efficient. Empirically, this preconditioner is accurate enough to result in $1\times10^{-3}$ relative error for the reconstruction of Wave-CAIPI data, which may be used as a convergence criteria. The sparse representation allows for significant speed-up as it does not depend on the number of receive channels or the over-sampling factor.

The sparse approximate encoding can also provide the advantage of reducing noise in the reconstructed images. By assuming that each voxel along the readout is only coupled to voxels that are separated by an integer multiple of the number of cycles away from it, the acquired data can be accurately binned. As one non-limiting example, if one assumes 30 cycles and an over-sampled readout length of 900, there will be 30 approximately separable encodings of size 30. The point spread function associated with Wave-CAIPI significantly blurs the data along the readout position to create a relatively incoherent pattern. This incoherency in the encoding process results in similarities in the data being binned. These similarities can be efficiently modeled using a low-rank representation, allowing for the removal of small differences. These small differences are often Gaussian noise. The low-rank modeling can be used directly to denoise the data or included as part of a constrained optimization using rank proxies. The low-rank modeling can be applied across similar channels, phase encode lines, slices, or contrasts to improve the compression.

The Wave-CAIPI encoding scheme can be described with reference to the following orthogonal spatial encoding directions common to magnetic resonance imaging ("MRI"): a partition-encoding, a phase-encoding direction, and a frequency-encoding direction. Alternatively, the partition-encoding direction may be simply referred to as a second phase-encoding direction. When two-dimensional images are acquired, the partition-encoding direction may be referred to as a slice-encoding direction. By way of example, as referred to herein, the partition-encoding direction corresponds to the z-direction in the image domain, which is aligned along the longitudinal axis of the bore of an MRI system, and the $k_z$-direction in k-space. In this manner, the obtained images are transverse, or axial, images lying in the x-y plane. Accordingly, as referred to herein, the phase-encoding direction corresponds to the y-direction in the image domain, and the $k_y$-direction in k-space; and the frequency-encoding direction corresponds to the x-direction in the image domain, and the $k_x$-direction in k-space. It will be appreciated by those skilled in the art that any suitable permutation of these directions, or any set of orthogonal oblique directions, is possible and within the scope of the present invention. The choice of these directions is typically made depending on the desired imaging application, such as whether it is desirable to acquire axial, sagittal, coronal, or oblique images of a subject.

In Wave-CAIPI encoding scheme, additional differential encoding information is provided by applying alternating gradients along the two directions orthogonal to the readout direction. The result of these gradients being played out in the presence of a readout gradient is to more uniformly distribute aliasing patterns throughout k-space, thereby improving the ability to separate the aliased signals. In this manner, the so-called g-factor penalty for parallel image reconstruction can be reduced. The Wave-CAIPI encoding scheme can be implemented with rectilinear, radial, spiral, and other such sampling patterns.

An example of k-space trajectories that can be implemented in a Wave-CAIPI encoding scheme is shown in FIG. 1. Each k-space trajectory generally includes a corkscrew trajectory that is centered on and spirals around an axis extending along the readout direction (e.g., the $k_x$ direction in this example). The starting point of each k-space trajectory is generally defined by the amplitude and polarity of phase-encoding and partition-encoding gradients, the selection of which can be made in different ways to achieve different samplings of k-space. In the example shown in FIG. 1, the starting positions of the k-space trajectories are staggered, or shifted, on a grid to distribute aliasing patterns in three spatial dimensions. In other examples, the starting points can be evenly and uniformly distributed on a grid. In still other examples, the starting points can be randomly distributed, pseudorandomly distributed, or distributed in otherwise non-uniform ways.

Figure 2:
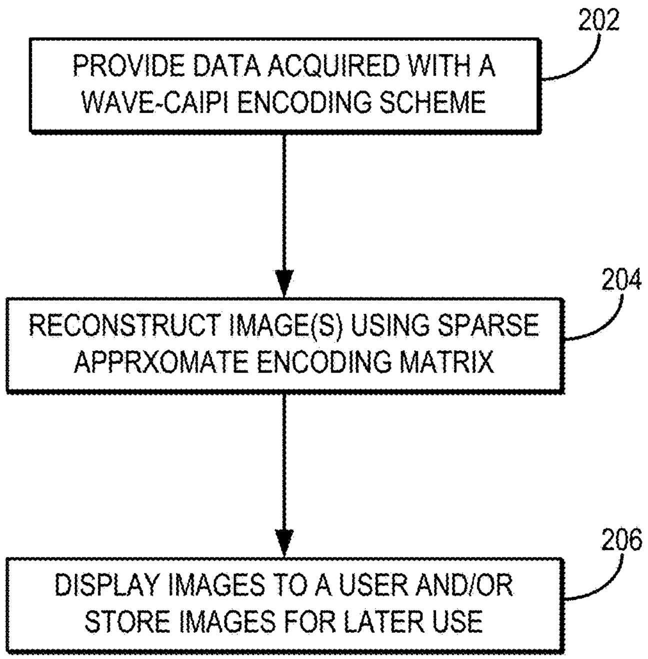
FIG. 2 is a flowchart of an example method for generating images from magnetic resonance data acquired using a Wave-CAIPI encoding scheme and using a sparse approximate encoding matrix in the image reconstruction.

Referring now to FIG. 2, a flowchart is illustrated as setting forth the steps of an example of a method for reconstructing images from data acquired using the encoding schemes described in the present disclosure. Data acquired using the encoding schemes described in the present disclosure are provided to a computer system, as indicated at step 202. Providing the data can include accessing previously acquired data from a memory or other data storage using the computer system, or can include acquiring the data with an MRI system and providing the acquired data to the computer system, which may be a part of the MRI system. As mentioned above, the data are preferably acquired using a Wave-CAIPI encoding scheme; however, other encoding schemes may also be implemented. Images are then reconstructed from the data using an image reconstruction techniques that incorporates a sparse approximate encoding into the reconstruction problem, as indicated at step 204. The reconstructed images are then displayed to a user, can be stored for later use, or both, as indicated at step 206.

Because the aliasing function of the alternating encoding gradients is known prior to the data acquisition, a generalized-SENSE reconstruction can be used to separate and reconstruct the aliased imaging slices. The generalized-SENSE formulation can be expressed as:

$$k=E\cdot i \quad (1);$$

where k is the vector of acquired k-space data, E is an encoding matrix, and i is the image vector sought, usually via conjugate gradient. The encoding matrix, E, can often times be very large and, therefore, computationally burdensome to invert; however, in some instances various iterative techniques, such as the conjugate gradient method, may be used to find the target images, i. Thus, as described above, the Wave-CAIPI encoding matrix can be approximated by assuming an encoding sparsity pattern based upon the number of cycles played out by the imaging sequence. As one non-limiting example, it can be assumed that a given readout position is only coupled to voxels that are separated by an integer multiple of the number of cycles away from it. Given this fixed pattern, an encoding matrix with a sparse block Toeplitz matrix structure can be efficiently formed. The sparse encoding matrix, $\tilde{E}$, can be scaled by the sensitivity weights contained in coil sensitivity data.

Figure 3:
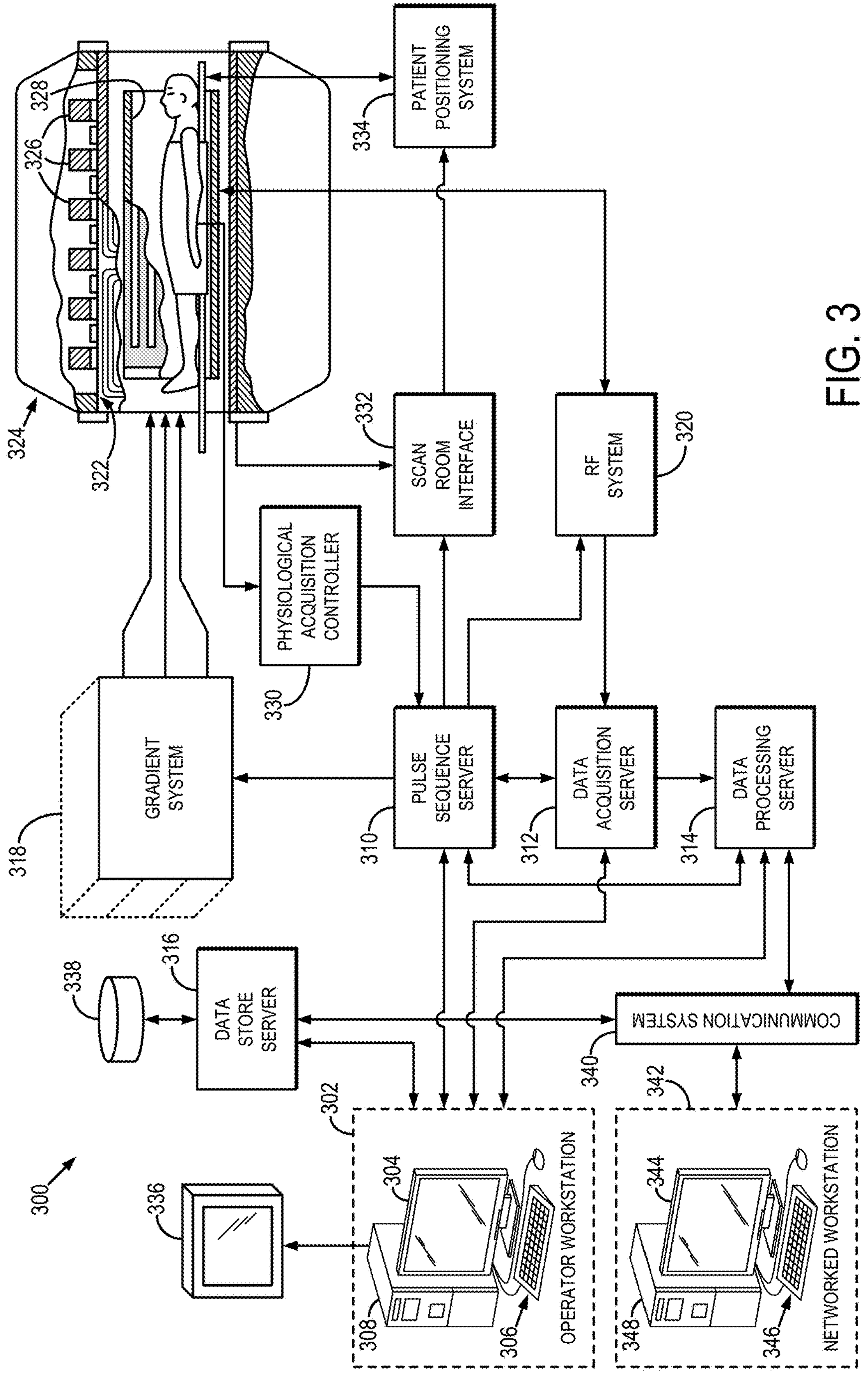
FIG. 3 is a block diagram of an example MRI system that can implement the methods described in the present disclosure.

Referring particularly now to FIG. 3, an example of an MRI system 300 that can implement the methods described here is illustrated. The MRI system 300 includes an operator workstation 302 that may include a display 304, one or more input devices 306 (e.g., a keyboard, a mouse), and a processor 308. The processor 308 may include a commercially available programmable machine running a commercially available operating system. The operator workstation 302 provides an operator interface that facilitates entering scan parameters into the MRI system 300. The operator workstation 302 may be coupled to different servers, including, for example, a pulse sequence server 310, a data acquisition server 312, a data processing server 314, and a data store server 316. The operator workstation 302 and the servers 310, 312, 314, and 316 may be connected via a communication system 340, which may include wired or wireless network connections.

The pulse sequence server 310 functions in response to instructions provided by the operator workstation 302 to operate a gradient system 318 and a radiofrequency ("RF") system 320. Gradient waveforms for performing a prescribed scan are produced and applied to the gradient system 318, which then excites gradient coils in an assembly 322 to produce the magnetic field gradients $G_x$, $G_y$, and $G_z$ that are used for spatially encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil to perform the prescribed magnetic resonance pulse sequence. Responsive magnetic resonance signals detected by the RF coil 328, or a separate local coil, are received by the RF system 320. The responsive magnetic resonance signals may be amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the prescribed scan and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. An RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=I^2+Q^2 \quad (2);$$

and the phase of the received magnetic resonance signal may also be determined according to the following relationship:

$$\varphi = \tan^{-1}\left(\frac{Q}{I}\right). \quad (3)$$

The pulse sequence server 310 may receive patient data from a physiological acquisition controller 330. By way of example, the physiological acquisition controller 330 may receive signals from a number of different sensors connected to the patient, including electrocardiograph ("ECG") signals from electrodes, or respiratory signals from a respiratory bellows or other respiratory monitoring devices. These signals may be used by the pulse sequence server 310 to synchronize, or "gate," the performance of the scan with the subject's heart beat or respiration.

The pulse sequence server 310 may also connect to a scan room interface circuit 332 that receives signals from various sensors associated with the condition of the patient and the magnet system. Through the scan room interface circuit 332, a patient positioning system 334 can receive commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, so that data is not lost by data overrun. In some scans, the data acquisition server 312 passes the acquired magnetic resonance data to the data processor server 314. In scans that require information derived from acquired magnetic resonance data to control the further performance of the scan, the data acquisition server 312 may be programmed to produce such information and convey it to the pulse sequence server 310. For example, during pre-scans, magnetic resonance data may be acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also process magnetic resonance signals used to detect the arrival of a contrast agent in a magnetic resonance angiography ("MRA") scan. For example, the data acquisition server 312 may acquire magnetic resonance data and processes it in real-time to produce information that is used to control the scan.

The data processing server 314 receives magnetic resonance data from the data acquisition server 312 and processes the magnetic resonance data in accordance with instructions provided by the operator workstation 302. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 314 are conveyed back to the operator workstation 302 for storage. Real-time images may be stored in a data base memory cache, from which they may be output to operator display 302 or a display 336. Batch mode images or selected real time images may be stored in a host database on disc storage 338. When such images have been reconstructed and transferred to storage, the data processing server 314 may notify the data store server 316 on the operator workstation 302. The operator workstation 302 may be used by an operator to archive the images, produce films, or send the images via a network to other facilities.

The MRI system 300 may also include one or more networked workstations 342. For example, a networked workstation 342 may include a display 344, one or more input devices 346 (e.g., a keyboard, a mouse), and a processor 348. The networked workstation 342 may be located within the same facility as the operator workstation 302, or in a different facility, such as a different healthcare institution or clinic.

The networked workstation 342 may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342.

Figure 4:
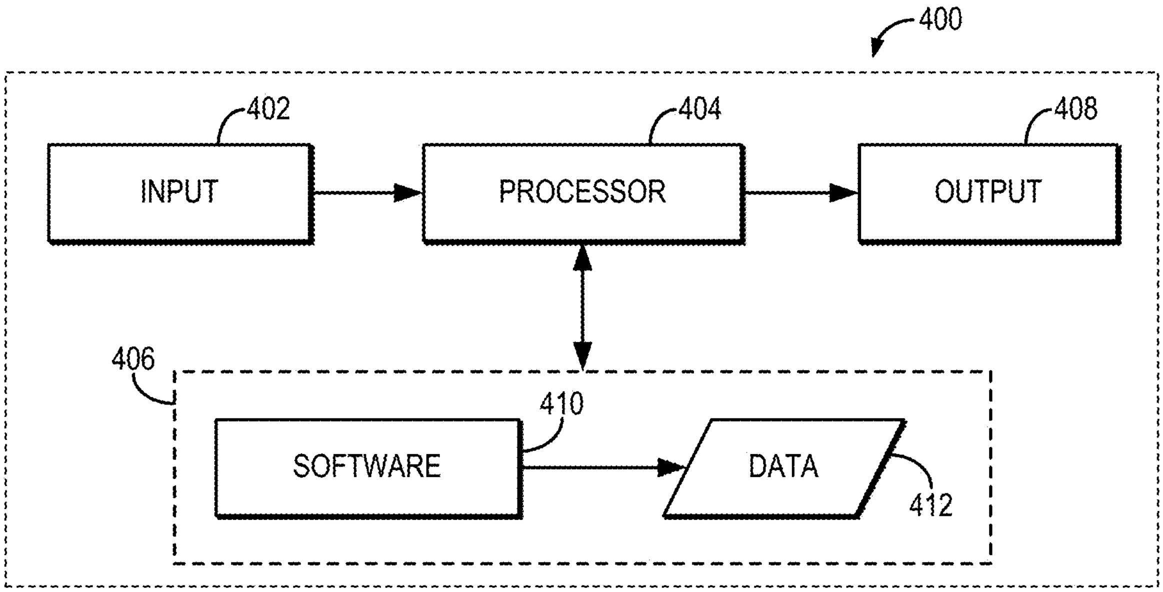
FIG. 4 is a block diagram of an example computer system that can implement the methods described in the present disclosure.

Referring now to FIG. 4, a block diagram of an example of a computer system 400 that can perform the methods described in the present disclosure is shown. The computer system 400 generally includes an input 402, at least one hardware processor 404, a memory 406, and an output 408. Thus, the computer system 400 is generally implemented with a hardware processor 404 and a memory 406.

In some embodiments, the computer system 400 can be a workstation, a notebook computer, a tablet device, a mobile device, a multimedia device, a network server, a mainframe, one or more controllers, one or more microcontrollers, or any other general-purpose or application-specific computing device.

The computer system 400 may operate autonomously or semi-autonomously, or may read executable software instructions from the memory 406 or a computer-readable medium (e.g., a hard drive, a CD-ROM, flash memory), or may receive instructions via the input 402 from a user, or any another source logically connected to a computer or device, such as another networked computer or server. Thus, in some embodiments, the computer system 400 can also include any suitable device for reading computer-readable storage media.

In general, the computer system 400 is programmed or otherwise configured to implement the methods and algorithms described in the present disclosure. For instance, the computer system 400 can be programmed to reconstruct images from magnetic resonance data.

The input 402 may take any suitable shape or form, as desired, for operation of the computer system 400, including the ability for selecting, entering, or otherwise specifying parameters consistent with performing tasks, processing data, or operating the computer system 400. In some aspects, the input 402 may be configured to receive data, such as data acquired with an MRI system. Such data may be processed as described above to reconstruct images of a subject. In addition, the input 402 may also be configured to receive any other data or information considered useful for reconstructing images of a subject using the methods described above. As one example, such additional data may include coil sensitivity data.

Among the processing tasks for operating the computer system 400, the one or more hardware processors 404 may also be configured to carry out any number of post-processing steps on data received by way of the input 402.

The memory 406 may contain software 410 and data 412, such as data acquired with an MRI system, and may be configured for storage and retrieval of processed information, instructions, and data to be processed by the one or more hardware processors 404. In some aspects, the software 410 may contain instructions directed to reconstructing images as described in the present disclosure.

In addition, the output 408 may take any shape or form, as desired, and may be configured for displaying reconstructed images, in addition to other desired information.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

The present disclosure has described one or more preferred embodiments, and it should be appreciated that many equivalents, alternatives, variations, and modifications, aside from those expressly stated, are possible and within the scope of the invention.

The invention claimed is:

1. A method for reconstructing an image of a subject using a magnetic resonance imaging (MRI) system, the steps of the method comprising:

(a) accessing with a computer system, data acquired from a subject using an MRI system and an RF coil array, wherein the data were acquired using an encoding scheme that distributes aliased spatial frequency information in three dimensions in k-space; and (b) reconstructing an image of the subject from the data using the computer system by inputting the data to an iterative reconstruction algorithm that solves an image reconstruction problem by implementing a sparse approximate encoding matrix as a preconditioner on the reconstruction problem, generating output as the reconstructed image, wherein the preconditioner removes a dependency of the reconstruction problem on a channel count of the RF coil array and over-sampling factors.

2. The method as recited in claim 1, wherein the sparse approximate encoding matrix is a sparse block Toeplitz matrix.

3. The method as recited in claim 1, wherein the sparse approximate encoding matrix is scaled with sensitivity weights.

4. The method as recited in claim 3, wherein the sensitivity weights are contained in coil sensitivity data accessed with the computer system.

5. The method as recited in claim 1, wherein a size of blocks in the sparse approximate encoding matrix is selected as a number of readout voxels.

6. The method as recited in claim 1, wherein a number of blocks in the sparse approximate encoding matrix is selected based on an acceleration factor used when acquiring the data.

7. The method as recited in claim 1, wherein step (b) includes binning the data based on similarities of data in each bin, wherein the similarities are related to an incoherency of the encoding scheme.

8. The method as recited in claim 7, wherein the similarities of the data in each bin are modeled using a low-rank representation.

9. The method as recited in claim 1, wherein the sparse approximate encoding matrix assumes that a given readout position is coupled only to voxels that are separated away from the given readout position by an integer multiple of a number of cycles played out when acquiring the data.

10. The method as recited in claim 9, wherein the sparse approximate encoding matrix has a sparse block Toeplitz structure.

11. The method as recited in claim 10, wherein the sparse block Toeplitz structure is comprised of blocks having a size determined by a number of readout voxels.

12. The method as recited in claim 10, wherein the sparse block Toeplitz structure is comprised of blocks, wherein a number of the blocks is determined based on an acceleration factor used when acquiring the data.

13. The method as recited in claim 1, wherein the preconditioner removes the dependency of the reconstruction problem on the array coil channel count and over-sampling factors by approximating an encoding matrix used in the reconstruction problem by assuming an encoding sparsity pattern that is based on a number of cycles played out in an imaging pulse sequence used when acquiring the data with the MRI system.

14. The method as recited in claim 1, wherein the preconditioner removes the dependency of the reconstruction problem on the array coil channel count and over-sampling factors by approximating an encoding matrix by assuming that each voxel along the readout direction in the reconstructed image is only coupled to other voxels that are separated by an integer multiple of the number of cycles away from that voxel.

* * * * *